(12) United States Patent
Chan et al.

(10) Patent No.: US 6,803,607 B1
(45) Date of Patent: Oct. 12, 2004

(54) SURFACE MOUNTABLE LIGHT EMITTING DEVICE

(75) Inventors: Keong Mun Chan, Hong Kong (CN); Victor Yue Kwong Lau, Hong Kong (CN)

(73) Assignee: Cotco Holdings Limited, Kwai Chung (HK)

( * ) Notice: Subject to any disclaimer, the term of this patent is extended or adjusted under 35 U.S.C. 154(b) by 0 days.

(21) Appl. No.: 10/462,089

(22) Filed: Jun. 13, 2003

(51) Int. Cl.$^7$ .............................................. H01L 33/00
(52) U.S. Cl. ........................... 257/98; 257/100; 257/95
(58) Field of Search ............................ 257/98, 100, 95, 257/79

(56) References Cited

U.S. PATENT DOCUMENTS

| | | | |
|---|---|---|---|
| 5,055,892 A | * 10/1991 | Gardner et al. ................ | 257/99 |
| 5,959,316 A | 9/1999 | Lowery ......................... | 257/98 |
| 6,473,554 B1 | 10/2002 | Popovich et al. ........... | 385/146 |
| 6,501,102 B2 | 12/2002 | Mueller-Mach et al. ...... | 257/84 |
| 6,515,314 B1 | 2/2003 | Duggal et al. ............... | 257/184 |
| 6,521,915 B2 | 2/2003 | Odaki et al. .................. | 257/98 |
| 6,541,800 B2 | 4/2003 | Barnett et al. ................ | 257/98 |
| 6,576,488 B2 | 6/2003 | Collins, III et al. ........... | 257/98 |
| 6,580,097 B1 | 6/2003 | Soules et al. ................ | 257/100 |
| 2001/0050371 A1 | 12/2001 | Odaki et al. .................. | 257/98 |
| 2002/0030194 A1 | 3/2002 | Cammas et al. .............. | 257/98 |
| 2003/0030060 A1 | 2/2003 | Okazaki ....................... | 257/79 |
| 2003/0038291 A1 | 2/2003 | Cao ........................... | 257/81 |
| 2004/0084687 A1 | * 5/2004 | Hohn et al. .................. | 257/100 |

* cited by examiner

*Primary Examiner*—Phat X. Cao
(74) *Attorney, Agent, or Firm*—Thomas F. Lebens; Sinsheimer, Schiebelhut & Baggett (57) ABSTRACT

This invention relates to a surface mountable light emitting device in which the lead frame is exposed over a substantial portion of the underside of the device so as to allow greater thermal conductivity to any device on which it may be mounted. The LED provides the lens and a molded body to encapsulate the lead frame and an electrical contact in a single molding step while the lead frames and further contacts are arranged in a suitable array. The lens couples the luminous output of a light-emitting diode (LED) to a predominantly spherical pattern comprises a transfer section that receives the LED's light within it and an ejector atop it that receives light from the transfer section and spreads it spherically. Applications may include, but are not limited to, household light bulbs and car headlights.

22 Claims, 6 Drawing Sheets

Fig. 7

SURFACE MOUNTABLE LIGHT EMITTING DEVICE

BACKGROUND OF THE INVENTION

This invention relates to a surface mountable light emitting device, particularly, a surface mountable light emitting device having a high power capacity.

Conventional light emitting diodes provide a light emitting semiconductor chip within a metal cup, a lead wire to a further contact on the chip, a bullet lens over the structure and a body around the structure. Often the body would be formed integrally with the bullet lens. Both the cup and the lead wire are attached to legs extending from an underside of the body for connection through a printed circuit board into a suitable circuit.

The manufacture of products that utilize large numbers of light emitting diodes may favor the use of surface mountable devices. The attachment of many such LEDs to, for example, a printed circuit board holding the driving circuitry can be achieved considerably more economically by automated machines. If such a machine can operate on a single side of the printed circuit board to place and secure the LED, significant savings may be made, and the reverse side of the printed circuit board can be left free for the provision of the driving circuitry. All of this requires a surface mountable device that avoids the traditional placement of the legs of the LED through a printed circuit board and soldering on the reverse side of the board.

A variety of methods have been attempted to achieve a suitable surface mountable light emitting device. Usually, such methods have involved the protrusion of the lead wire and a connection to the lead frame at the side of the device for attachment to the surface on which it is to be mounted. Although surface mountable, such connections are arranged around a perimeter of the device, which limits the density at which they may be mounted on the surface.

A further problem with light emitting devices occurs more permanently with high power devices. An LED running at high power, such as at one watt generates a significant amount of heat. This heat can deteriorate the performance of the LED or, over time, lead to the destruction or burn out of the LED.

Although the heat may be dissipated by the surrounding apparatus, this still requires the transfer of the heat from the source, to outside of the LED. The legs extending from the body of the LED provide a relatively small thermal pathway, and do not allow sufficient heat dissipation to allow high power units on the order of one watt.

A yet further difficulty in the subject art arises in the manufacture of LEDs. It is difficult to provide a process that allows easy manufacture of LEDs with a minimum of components while assuring the requirements, e.g., greater heat dissipation, of high power units are met.

Also, conventional LEDs are optically unsuitable for direct installation into devices such as headlamps or flashlights that use parabolic reflectors. This is because the bullet lenses used form a narrow beam that completely misses a nearby parabolic reflecting surface. Using, instead, a hemispherically emitting non-directional dome, centered on a luminous LED die, gives a maximum spread commercially available, a Lambertian pattern. Since θ for a typical parabolic flashlight reflector extends from 45° to 135°, an LED with a hemispheric pattern is still mismatched with respect to a parabolic reflector because the LED's emission falls to zero at only θ=90°. This results in a beam that is brightest on the outside edges and completely dark halfway in to its center. Worse yet, even this inferior beam pattern from a hemispheric LED requires that the LED be held up at the parabola's focal point, several millimeters above the socket wherein a conventional incandescent bulb would be installed.

There is thus a need in the art for an effective and optically suitable surface mountable light emitting device (LED) that avoids the traditional placement of the legs of the LED through a printed circuit board and soldering on the reverse side of the printed circuit board, provides sufficient heat dissipation, allows easy manufacture with minimum components, ensures the requirements of high power usage are met, and is optically suitable for direct installation into devices that use parabolic reflectors as replacements for tungsten filament light bulbs.

SUMMARY OF THE INVENTION

The present invention advantageously addresses the needs above as well as other needs by providing a surface mountable light emitting device that avoids the traditional placement of legs of the LED through a printed circuit board, and soldering of the legs to the printed circuit board on the reverse side of the printed circuit board, provides sufficient heat dissipation, allows easy manufacture with minimum components, ensures the requirements of high power usage are met, and is optically suitable for direct installation into devices that use parabolic reflectors and replacement of tungsten filament light bulbs.

In one embodiment, the invention can be characterized as a high power, surface mountable light emitting device comprising a light emitting semiconductor chip, a thermally and electrically conductive lead frame connected to said chip and exposed over a substantial portion of the underside of the device, a lead wire from said chip to a contact exposed at least partially on a side of said device and a lens over said chip.

The lens comprises a lower transfer section and an upper ejector section situated upon the lower transfer section. The lower transfer section is operable for placement upon the light emitting semiconductor chip and operable to transfer the radiant emission to said upper ejector section. The upper ejector section is shaped such that the emission is redistributed externally into a substantial solid angle.

A better understanding of the features and advantages of the present invention will be obtained by reference to the following detailed description of the invention and accompanying drawings, which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
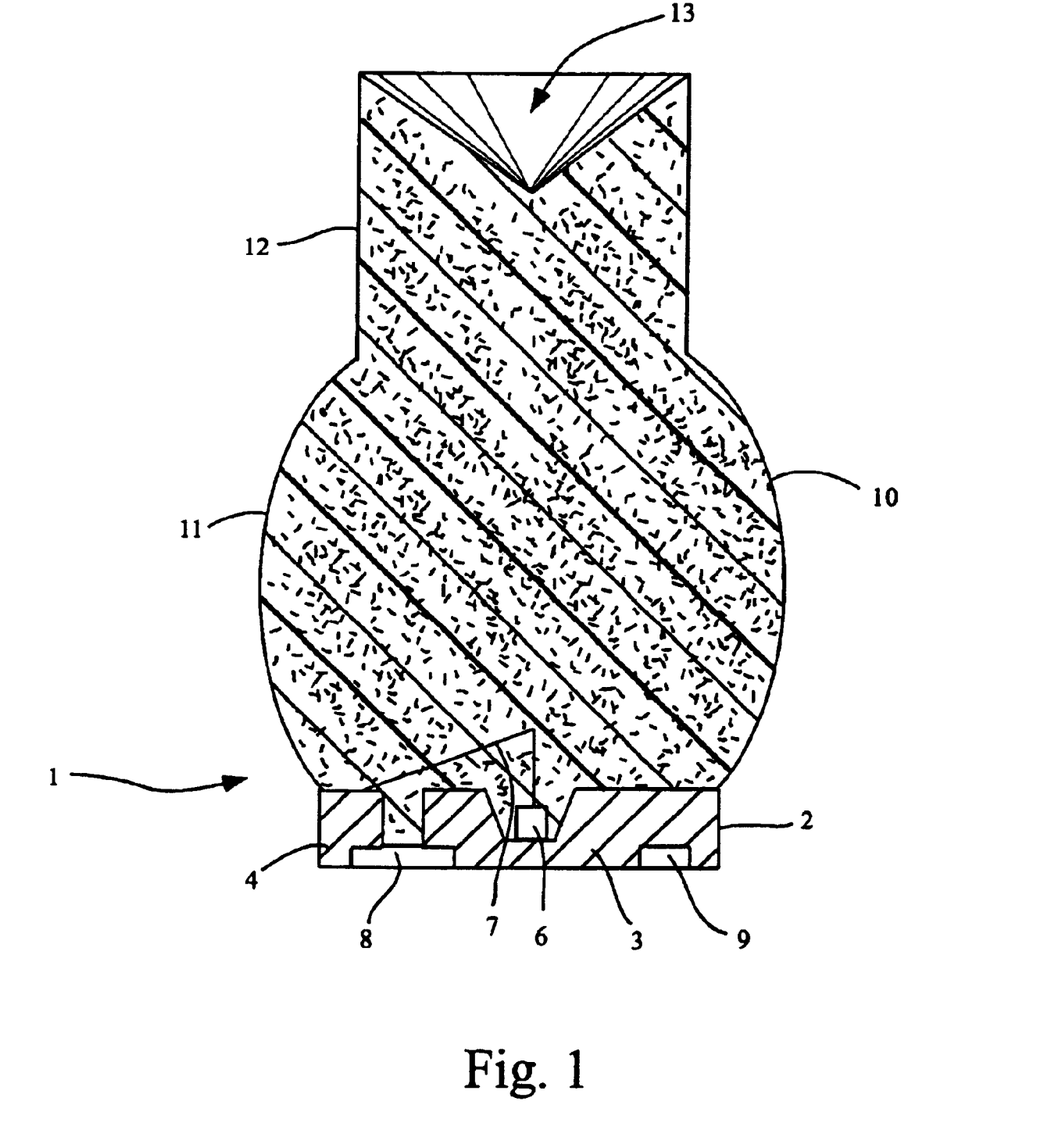
FIG. 1 is a side cross-sectional view of an optical device according to an embodiment of the present invention.
Figure 2A:
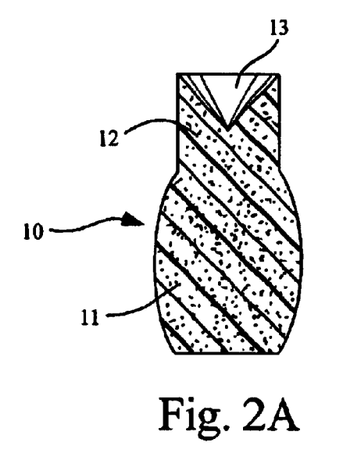
FIGS. 2A through 2F are side cross-sectional, top perspective, bottom perspective, side, top planar, and side elevational views, respectively, of the lens of the optical device of FIG. 1 according to an embodiment of the present invention.
Figure 2B:
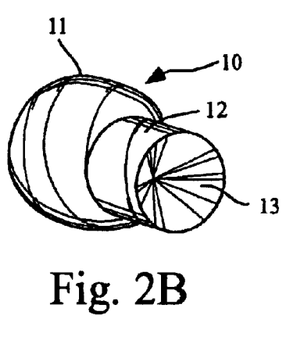
Figure 2C:
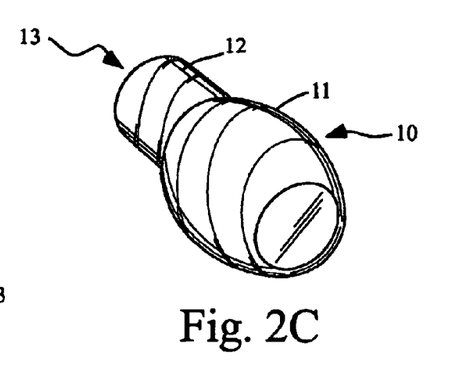
Figure 2D:
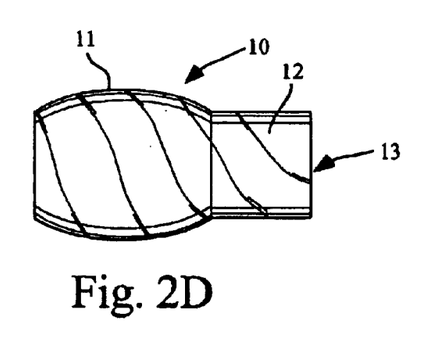
Figure 2E:
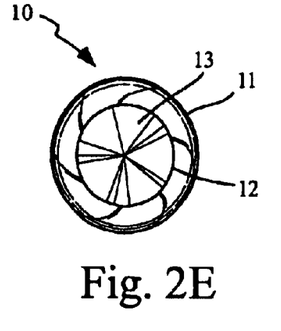
Figure 2F:
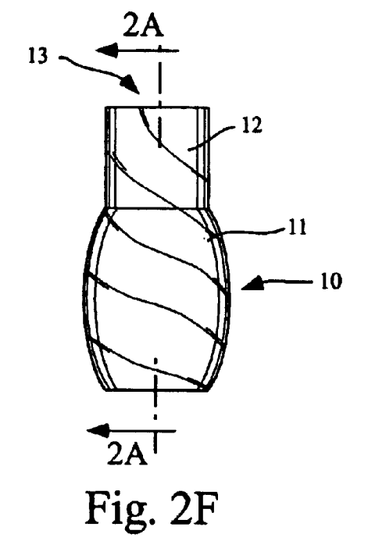

Referring to FIG. 1, shown is a side cross-sectional view of an optical device according to an embodiment of the present invention.

Shown is a light emitting device 1 having a main body portion 2 according to that described in Hong Kong patent application No. 03104219.4 filed Jun. 12, 2003 for A SURFACE MOUNTABLE LIGHT EMITTING DEVICE AND METHOD OF MANUFACTURE, the entirety of which is hereby incorporated by reference, and lens 10 according to that described in U.S. patent application Ser. No. 60/470,691 of Minano et al., for OPTICAL DEVICE FOR LED-BASED LIGHT-BULB SUBSTITUTE, filed May 13, 2003, and U.S. patent application Ser. No. 10/461,557 of Minano et al., for OPTICAL DEVICE FOR LED-BASED LIGHT-BULB SUBSTITUTE, filed Jun. 12, 2003, the entirety of which is also hereby incorporated by reference. The main body portion 2 has a lead frame 3, a further contact 4, an LED semiconductor chip 6, electrical connection 7, and portions of a transparent optical molded compound 8, 9. A lens 10 comprises a lower transfer section 11, an upper ejector section 12 and a conical indentation 13.

The lead frame 3 is located in the main body portion 2. The LED semiconductor chip 6 is mounted on the lead frame 3. A further contact 4 to provide the path for current through the chip 6 is also provided and attached to the semiconductor chip 6 by an electrical connection 7 such as a lead bonding wire. Preferably the LED semiconductor chip is a single bond pad LED, but may also be a double bond pad LED (which would require an additional cathode bonding wire). The lens 10 is provided over an upper surface to encapsulate the semiconductor chip 6 and provide preferred optical characteristics.

As also shown in this particular embodiment, the lens 5 and the main body portion 2 may be provided in a single molding step as integrally molded portions from the same material using a transparent optical molded compound. lternatively, the lens 10 may attach to the device 1 using optical grade glue. To act as a lens, material used to form the lens 10 should be substantially transparent, although not necessarily completely transparent as there may be some desire to adapt the optical characteristics of the output of the semiconductor chip with the lens 10. The molding of the lens 10 and the main body portion 2 in a single integral structure allows the transparent optical molded compound to be keyed into the lead frame 3 and further contact 4 by the portions of the transparent optical molded compound 8 and 9. This helps secure the lead frame 3 and further contact 4 in place in the final device with minimal need for adherence between the transparent optical molded compound and the metal of the lead frame 3 and the further contact 4.

The semiconductor chip 6 is recessed into a recess within the lead frame 3 such that the sides of the recess act as a reflector. The purpose of such a reflector around the semiconductor chip 6 is to redirect light that may be emitted from the sides of the semiconductor and reflect the light generally out through the transparent optical molded compound 5 upwardly from the semiconductor chip 6.

Example applications include, but are not limited to, replacement of incandescent lights or other luminaire light sources that are non-directional and pointed like an LED, replacement of a flashlight bulbs, use as exterior and interior automotive lights, use in miniature industrial light bulbs, and any other lighting applications that require use of a pseudo filament to mimic traditional luminaries. This may include, for example, marine control panels or dashboard lights, avionic cockpit panel lights and other interior lighting that utilizes miniature light bulbs.

Referring next to FIGS. 2A through 2F, shown are side cross-sectional, top perspective, bottom perspective, side, top planar, and side elevational views, respectively, of the lens 10 of the optical device 1 of FIG. 1 according to an embodiment of the present invention.

Shown are the lens 10, lower transfer section 11, upper ejector section 12 and conical indentation 13.

The lens 10 comprises a lower transfer section 11 and an upper ejector section 12. The lens 10 is a substantially transparent solid in the general shape of a prolate ellipsoid and is a single piece of a transparent optical molded material such as acrylic or polycarbonate. The lens 10 is preferably a rotationally symmetric shape, larger in height than in diameter, but need not be so (e.g., a free form shape). The upper ejector section 12 is cylindrical, with a conical indentation 13 on top, having a core angle of approximately 80°.

The lower transfer section 11 uses internal reflection to relocate the device's 1 emission upward to a parabola's focal point. The upper ejector section sends the transferred light out (to a parabolic reflector, for example), sideways and downward at angles to the axis extending all the way to at least 135°, or a little more, (measured relative to a central axis of the ejector section, back toward the semiconductor chip 6) depending upon the reflector. At least half the ejected light should be at angles over 45° (measured relative to a central axis of the ejector section back toward the semiconductor chip 6), in order to illuminate a reflector (not shown) and form a sufficiently intense collimated beam.

In order to avoid an external reflective coating on the surface of the transfer section 11, its geometry must promote total internal reflection. This is why polycarbonate, with its higher refractive index (1.5855), is preferable to acrylic (1.492). Its correspondingly smaller critical angle, $\theta c = \sin^{-1}(1/n)$, of 39.°103 vs. 42.°1, reduces the height of the transfer section from 23.5 mm to 11.6 mm.

Figure 3A:
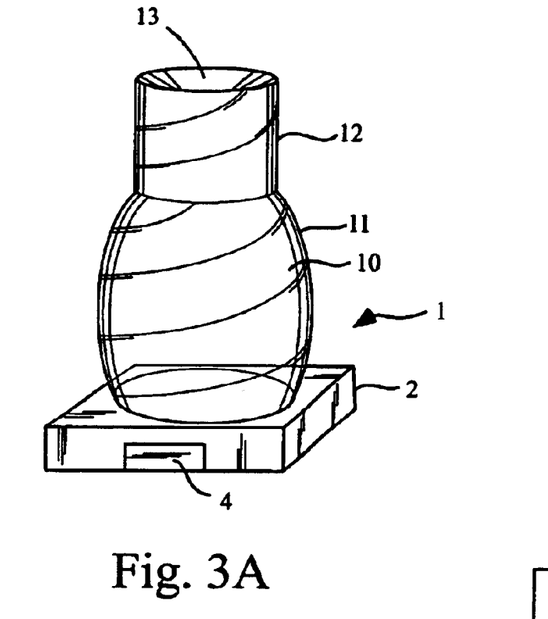
FIGS. 3A and 3B are side perspective and bottom planar views, respectively, of the optical device of FIG. 1.
Figure 3B:
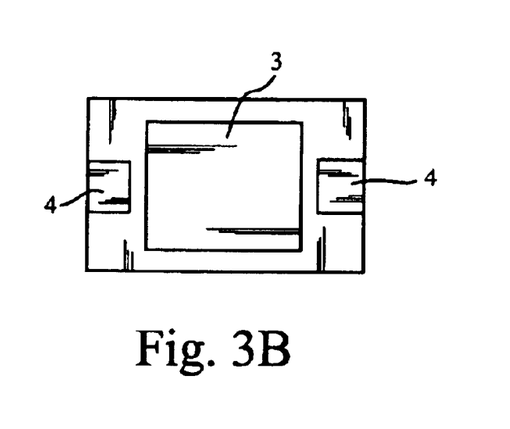

Referring next to FIGS. 3A and 3B, shown are side perspective and bottom planar views, respectively, of the optical device of FIG. 1.

Shown are the light emitting device 1, the main body portion 2, the lead frame 3, the further contacts 4, the lens 10, the lower transfer section 11, the upper ejector section 12 and the conical indentation 13.

The further contact 4 can be seen exposed on the side of the main body portion 2. It can also be seen in FIG. 3B that the lead frame 3 is exposed over a substantial portion of the underside of the device 1. This exposure of a large surface area of the lead frame 3 on the underside of the light emitting device 1 allows substantial heat to be drawn directly from the lead frame 3 into a surface on which the lead frame 3 may be mounted.

Figure 3C:
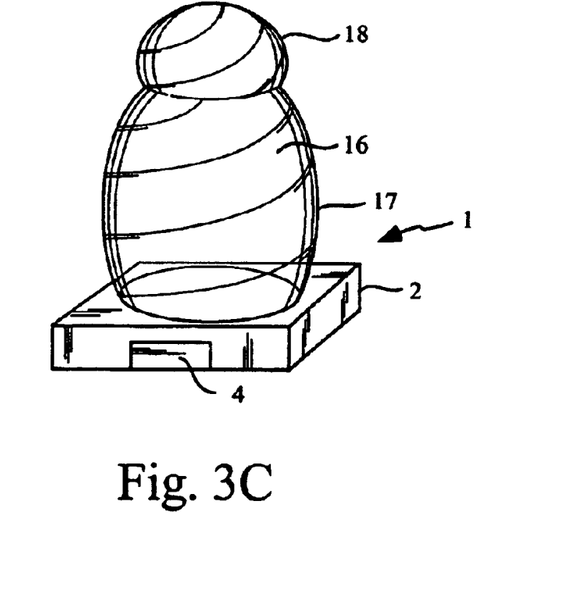
FIG. 3C is a side perspective view of an optical device according to an alternative embodiment of the present invention.

Referring next to FIG. 3C shown is a side perspective view of an optical device 1 according to an alternative embodiment of the present invention. Shown is the light emitting device 1, main body portion 2, further contact 4 and lens 16 comprised of an off-axis ellipsoidal transfer section 17 and a spherical, diffusive ejector section 18 according to that described in U.S. patent application Ser. No. 60/470,691 of Minano et al., for OPTICAL DEVICE FOR LED-BASED LIGHT-BULB SUBSTITUTE, filed May 13, 2003, and U.S. patent application Ser. No. 10/461,557 of Minano et al., for OPTICAL DEVICE FOR LED-BASED LIGHT-BULB SUBSTITUTE, filed Jun. 12, 2003.

The outer surface of the ejector section 18 has diffusive characteristics, (i.e. surface features that cause light to diffuse), so that each point on the ejector section 18 has a brightness proportional to the light received from the transfer section 17. The advantage of this kind of ejector section 18 is that the multiple wavelengths, for example, from a tricolor LED are mixed before they leave the ejector section 18. In the non-diffusive ejector section 12 discussed above, which is non-diffusive, the color mixing may be incomplete, leading to coloration of the output beam of a parabolic reflector. The lens 16 comprises an off-axis ellipsoidal lower section 17 and an upper spherical ejector section 18. The upper spherical ejector section 18 is smaller than the transfer section 17 (i.e., having a smaller diameter than a middle diameter of the transfer section 17). Due to the smaller upper spherical ejector section's size it radiates less in angles beyond 90° than if the upper spherical ejector section 18 were larger than the transfer section 17. Such a upper spherical ejector section will also act to mix the colors of the red, green, and blue source chips within an LED light source.

Figure 4A:
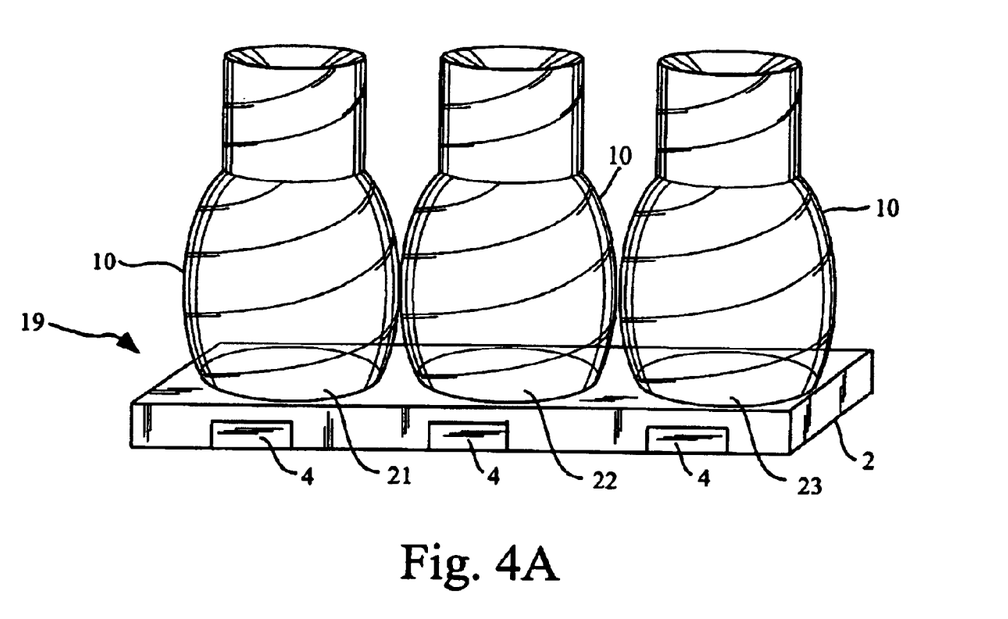
FIG. 4A is a side perspective view of an optical device according to an alternative embodiment of the present invention.
Figure 4B:
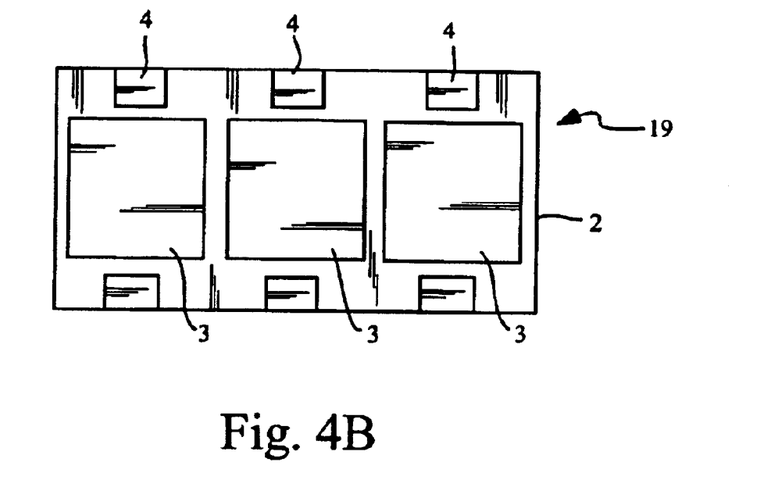
FIG. 4B is a bottom planar view of the device of FIG. 4A.

Referring next to FIGS. 4A and 4B, shown are a side perspective and bottom planar views, respectively of an optical device according to an alternative embodiment of the present invention.

Shown is the light emitting device 19, the main body portion 2, the lead frame 3, the further contacts 4, the LED components 21, 22, 23 and the lenses 10.

A plurality of individual LED components 21, 22, 23 are incorporated into a single device 19 as shown. Each individual LED component of the device 19 is structured and operates in the same way as that of FIG. 1. This embodiment may be utilized where a plurality of LEDs are necessary to provide a desired output from a device and rather than utilizing three single LEDs fitted individually. The surface mountable nature of the device 19 may provide advantages in placement of all LED components on a suitable substrate and driving mechanism such as a printed circuit board (PCB) while still co-joined.

Naturally, it will be further appreciated that the number of individual LEDs within the device 19 as shown in FIGS. 4A and 4B can be 2, 3 or any other number such as shown by way of example in FIG. 1 of Hong Kong patent application No. 03104219.4 filed Jun. 12, 2003 for A SURFACE MOUNTABLE LIGHT EMITTING DEVICE AND METHOD OF MANUFACTURE which has been incorporated by reference.

A yet further advantage of the embodiment as shown in FIGS. 4A and 4B is that different colored LEDs can be provided. For example, during the manufacturing process, a different chip may be fitted to each individual LED component 21, 22 and 23. This may allow, for example, a red, blue and green color arrangement through the use of a different color chip in each of the individual LED components 21, 22 and 23 so as to provide a full video color spectrum or the like. It will be appreciated that a variety of other color schemes are possible.

Figure 5A:
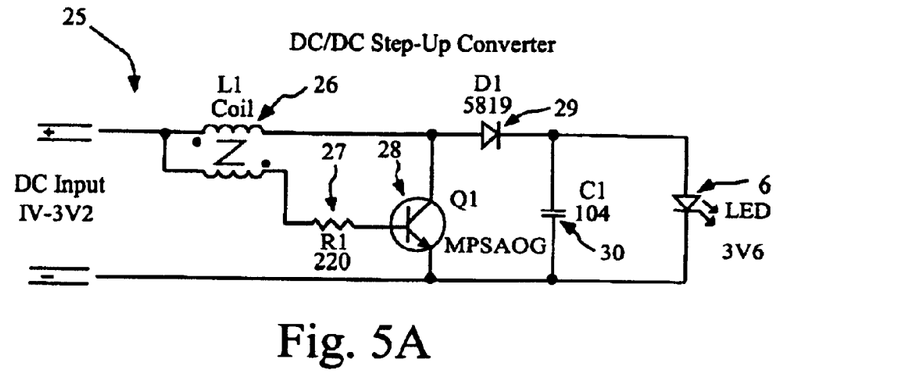
FIG. 5A is a schematic of a driving circuit of an optical device according to an embodiment of the present invention.

Referring next to FIG. 5A, shown is a schematic of a driving circuit of an optical device 6 according to an embodiment of the present invention.

Shown is a DC/DC step-up converter 25 having a coil 26, a resistor 27, a transistor 28, a diode 29, a capacitor 30 and an LED 6.

The step up converter (from 1V to 4V) uses +1 VDC to +3 VDC to drive the device 6 up to 70 Ma. The coil 26 and the transistor 28 are used as a switching regulator and the resistor 27 is used as a current control. The diode 29 provides a rectifier and the capacitor provides a ripple filter. In this case, a single 1.5V battery is utilized to drive the LED 6.

Figure 5B:
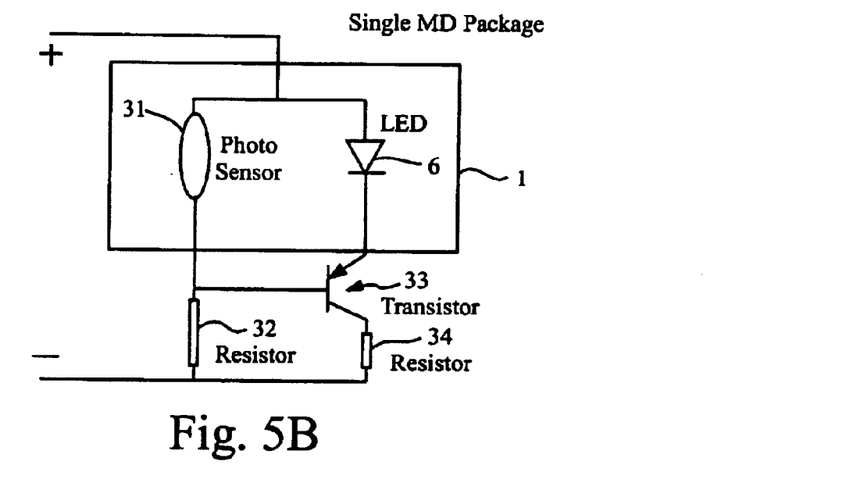
FIG. 5B is a schematic of a driving circuit of an optical device according to an alternative embodiment of the present invention.

Referring next to FIG. 5B, shown is a schematic of a driving circuit of an optical device 6 according to an alternative embodiment of the present invention.

Shown is a light emitting device 1, an LED 6, a photo sensor 31, a resistor 32, a transistor 33 and a resistor 34.

The light emitting device 1 (in this case a surface mountable diode package) circuit comprises a photo sensor 31 in die form and the LED 6 to which a resistor 32, a transistor 33 and a resistor 34 are connected. This allows for the LED 6 to activate based upon varying light levels detected by the photo sensor.

Figure 5C:
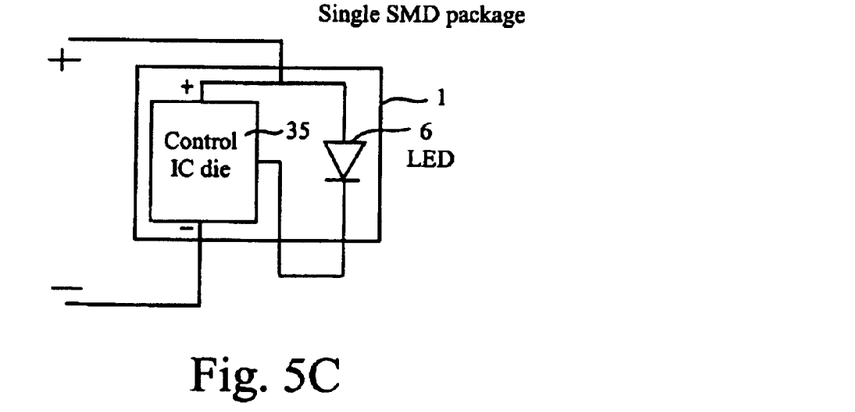
FIG. 5C is a schematic of a driving circuit of an optical device according to an alternative embodiment of the present invention utilizing an integrated circuit.

Referring next to FIG. 5C, shown is a schematic of a driving circuit of an optical device according to an alternative embodiment of the present invention utilizing an integrated circuit.

Shown is a light emitting device 1, an LED 6 and an integrated circuit control die 35. The integrated circuit control die 35 is operably between the LED 6 and a power source, such as a 1.5 V DC power source, to control operation of the LED 6. The integrated circuit control die 35 provides control, for example, for the LED 6 to flash or blink in a pattern.

Figure 6:
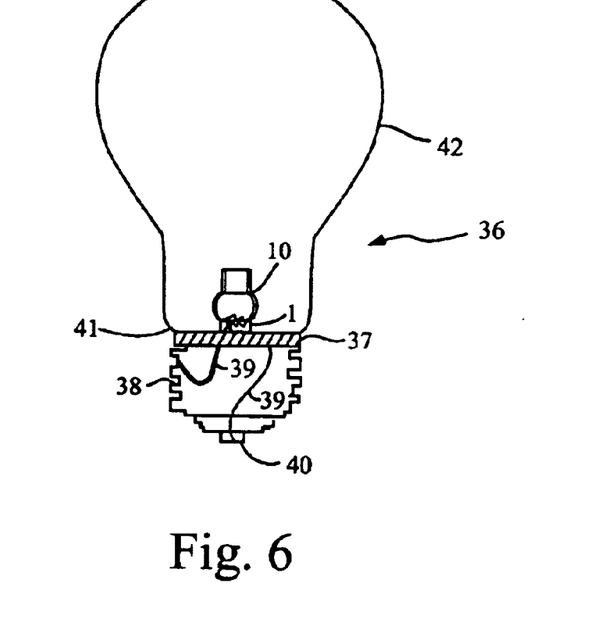
FIG. 6 is a side cross-sectional view of a light bulb integrating the device of FIG. 1 according to an embodiment of the present invention.

Referring next to FIG. 6, shown is a side cross-sectional view of a light bulb, integrating the device of FIG. 1 into a light bulb housing, according to an embodiment of the present invention.

Shown is a light bulb 36 having the light emitting device 1 of FIG. 1 with the lens 10, the printed circuit board (PCB) 37, an E10 lamp base 38, the wires 39 to the lamp base 38 and anode 40, an epoxy seal 41 and a glass encasement 42.

The light emitting device 1, which acts as the optical filament of the light bulb 36, is operably connected to the printed circuit board 37 secured at the top of the lamp base 38. Two wires 39 are operably connected each to the lamp base 38 and anode 40 to provide power to the light emitting device 1. The lens 10 has the inverted cone feature shown in, for example, FIG. 1 and is located inside the glass encasement 42 of the light bulb 36. The epoxy seal 41 is between the glass encasement 42 and the lamp base 38. The light emitting device 1 may also be used in applications such as exterior and interior automotive lights, wherein circuitry is provided in the printed circuit board to draw off a 2 amp current to drive the flasher circuit of the automobile (or whatever amount of current happens to required for the particular application).

Figure 7:
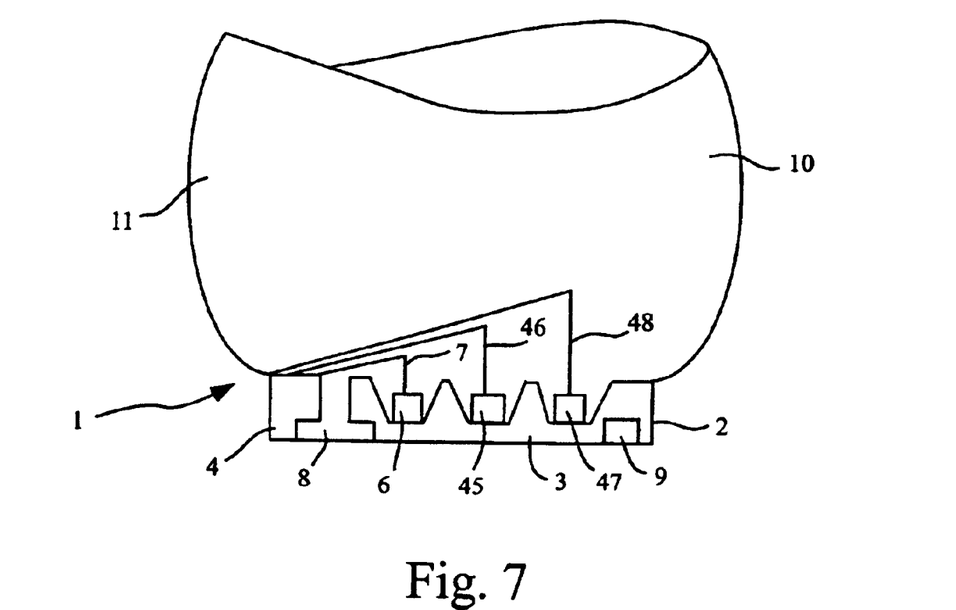
FIG. 7 is a partial side cross-sectional view of an optical device according to an alternative embodiment of the present invention.

Referring next to FIG. 7, shown is a partial side cross-sectional view of an optical device according to an alternative embodiment of the present invention.

Shown is a light emitting device 1 having a main body portion 2. The main body portion 2 is a variant of that of FIG. 1 in that it incorporates three semiconductor chips 6, 45, 47 in one surface mountable light emitting device 1. The light emitting device 1 has a lead frame 3, a further contact 4, electrical connections 7, 46, 48, and portions of a compound 8, 9. A lower transfer section 11 of the lens 10 of FIG. 1 is also partially shown.

The lead frame 3 is located in the main body portion 2. A plurality (three in this case) of semiconductor chips 6, 45, 47 are mounted on the lead frame 3. A further contact 4 to provide the path for current through the chip 6 is also provided and attached to the semiconductor chips 6, 45, 47 by electrical connections 7, 46, 48 such as a lead bonding wires. Preferably the semiconductor chips are single bond pad LEDs, but may also be a double bond pad LEDs (which would require an additional cathode bonding wire). The lens 10 (partially shown) is provided over an upper surface to encapsulate the chips 6, 45, 47 and provide preferred optical characteristics.

As also shown in this particular embodiment, the lens 5 and the main body portion 2 may be provided in a single molding step as integrally molded portions from the same material using a transparent optical molded compound. Alternatively, the lens 10 may attach to the device 1 using optical grade glue. To act as a lens, the material should be substantially transparent although not necessarily completely transparent as there may be some desire to adapt the optical characteristics of the output of the semiconductor chip with the lens. The semiconductor chips 6, 45, 47 are recessed into recesses within the lead frame such that sides of the recesses act as reflectors.

While the invention herein disclosed has been described by means of specific embodiments and applications thereof, numerous modifications and variations could be made thereto by those skilled in the art without departing from the scope of the invention set forth in the claims.

All references cited herein are herein incorporated by reference.

What is claimed is:

1. A high power surface mountable light emitting device comprising:
   a light emitting semiconductor chip;
   a thermally and electrically conductive lead frame connected to said chip and exposed over a substantial portion of the underside of the device;
   a lead wire from said chip to a contact exposed at least partially on a side of said device; and
   a lens over said chip wherein the lens comprises:
   a lower transfer section; and
   an upper ejector section situated upon the lower transfer section, said lower transfer section operable for placement upon the light emitting semiconductor chip and operable to transfer the radiant emission to said upper ejector section, said upper ejector section shaped such that the emission is redistributed externally into a substantial solid angle.

2. The device of claim 1 wherein the lower transfer section is a solid of revolution having a profile in the shape of an ellipse with a long axis parallel to an axis of revolution of the solid and displaced laterally therefrom so as to place the focus of said elliptical profile on the opposite side of said axis.

3. The device of claim 2 wherein the upper ejector section is a cylinder of the same diameter as a top diameter of the transfer section, said cylinder having a conical depression on its top surface.

4. The device of claim 2 wherein said lateral displacement substantially equals the radius of said ellipsoid at its focus.

5. The device of claim 1 wherein said upper ejector section is a conicoid.

6. The device of claim 1 wherein said upper ejector section is a everted sphere.

7. The device of claim 1 wherein said upper ejector section is an indented section of a sphere.

8. The device of claim 4 wherein said upper ejector section is a cylinder.

9. The device of claim 1 wherein the upper ejector section has a diffusive surface.

10. The device of claim 1 wherein the lens has a surface with graded sub-wavelength roughness for reflective scattering of said emitted light out of said device.

11. The device of claim 1 wherein the lens is made of transparent material for distributing the radiant emission of a light emitter, comprising an expander section for receiving said radiant emission and narrowing its angular range to that of light guiding via total internal reflection, and a cylindrical ejector section for receiving said angularly narrowed radiation and ejecting it by means of graded sub-wavelength roughness on its surface.

12. The device of claim 1 wherein said lens comprises substantially encasement of an upper side of said chip in a transparent compound.

13. The device of claim 12 wherein said transparent compound forms both a lens and a portion of the body about the lead frame.

14. The device of claim 13 wherein said transparent compound is keyed into the metallic lead frame and said contact to reduce separation.

15. The device of claim 1 wherein said device includes a reflector cup about said chip to reflect light from the sides of the chip generally into a direction extending from the upper surface of said chip.

16. The device of claim 15 wherein said reflector cup is metallic.

17. The device of claim 15 wherein said reflector cup comprises a core material with a highly reflective metallic coating.

18. The device of claim 17 wherein said reflective coating comprises chromium or silver plating.

19. The device of claim 18 wherein said lead frame comprises a substantially copper core with at least one other metal plating on an underside thereof.

20. The device of claim 19 wherein said metal plating on said underside of said lead frame comprises a plating of solder of palladium.

21. The device of claim 15 wherein said transparent compound comprises an epoxy resin.

22. The device of claim 1 wherein said lead wire to said contact is a gold wire.

* * * * *